United States Patent [19]

Merrill et al.

[11] Patent Number: 5,276,582
[45] Date of Patent: Jan. 4, 1994

[54] ESD PROTECTION USING NPN BIPOLAR TRANSISTOR

[75] Inventors: Richard B. Merrill, Daly City, Calif.; David C. Reynolds, Georgetown, Mass.; Doug Farrenkopf, Santa Clara, Calif.

[73] Assignee: National Semiconductor Corporation, Santa Clara, Calif.

[21] Appl. No.: 928,902

[22] Filed: Aug. 12, 1992

[51] Int. Cl.⁵ ............................................. H02H 9/04
[52] U.S. Cl. .................................... 361/111; 361/91
[58] Field of Search ........................... 361/56, 111, 91

[56] References Cited

U.S. PATENT DOCUMENTS 4,423,431 12/1983 Sasaki .................................... 361/56
4,712,152 12/1987 Liu ........................................ 361/56

*Primary Examiner*—Todd DeBoer
*Attorney, Agent, or Firm*—Limbach & Limbach

[57] ABSTRACT

A circuit for protecting an IC against electrostatic discharge includes a npn transistor having its collector connected to a first I/O pad and its emitter connected to VSS. A zener diode has its cathode connected to the first I/O pad, its anode connected both to the base of the npn transistor and to a first resistor. The other end of the resistor is connected to VSS.

4 Claims, 6 Drawing Sheets

SUBSTRATE AT GROUND

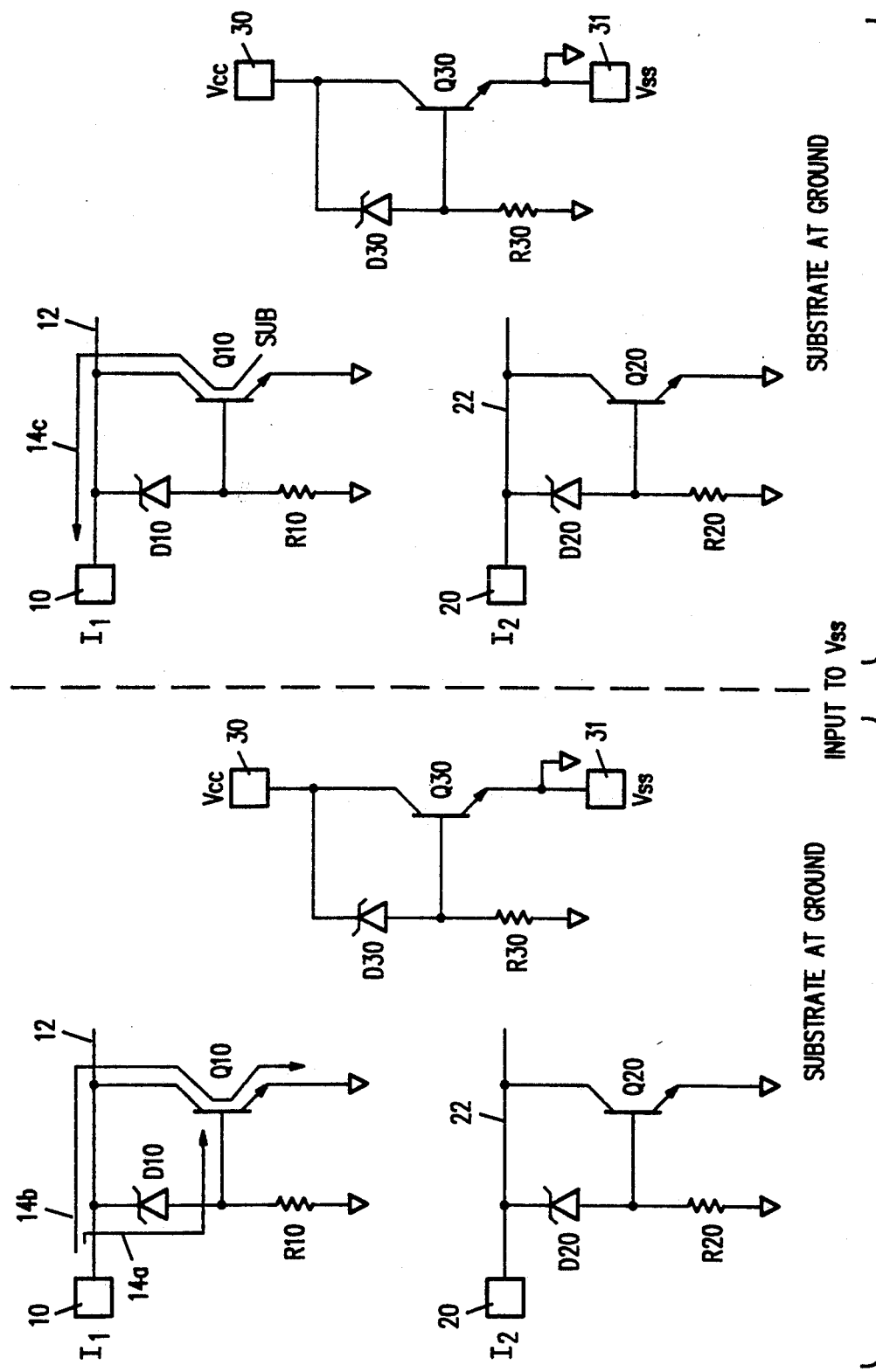

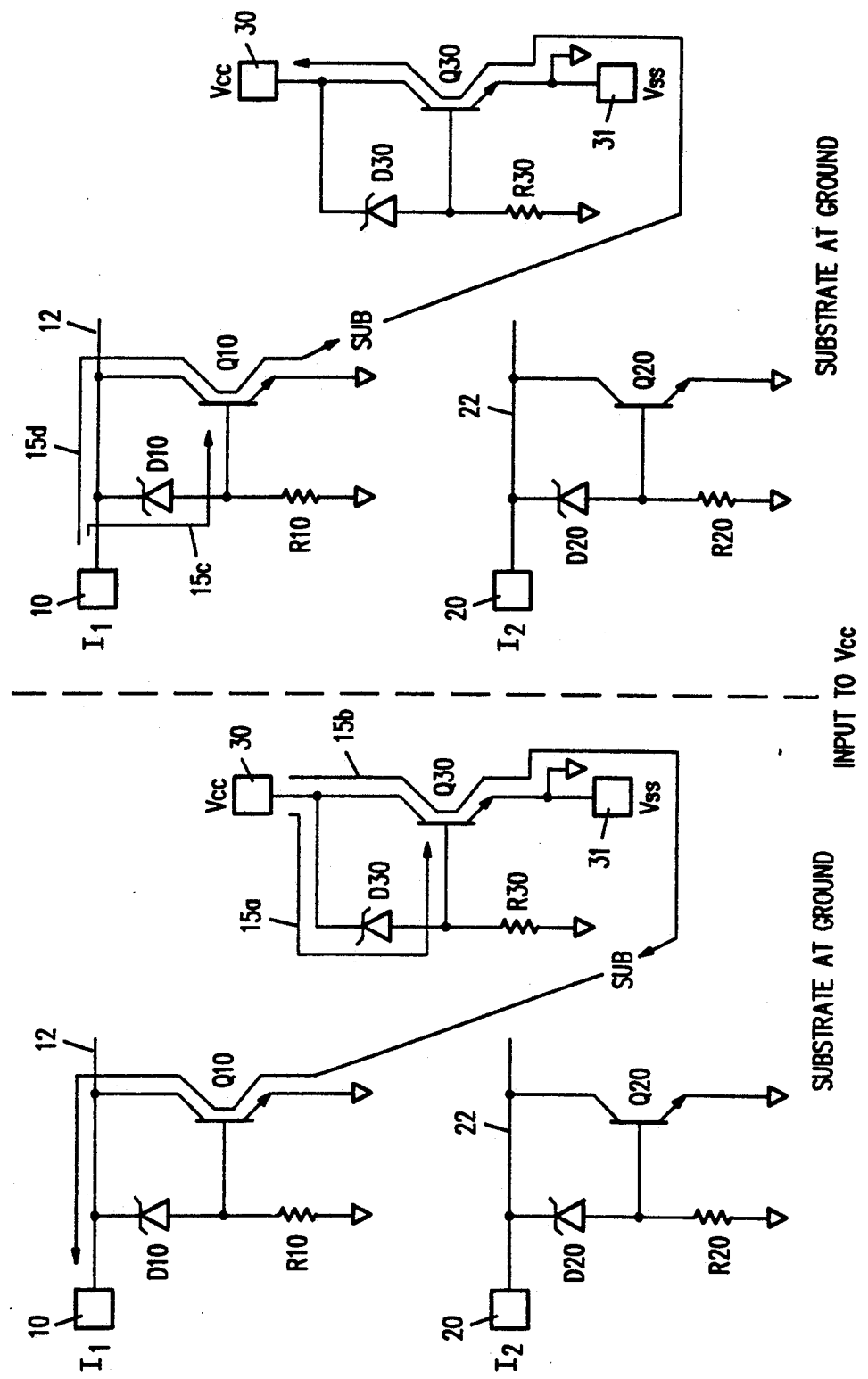

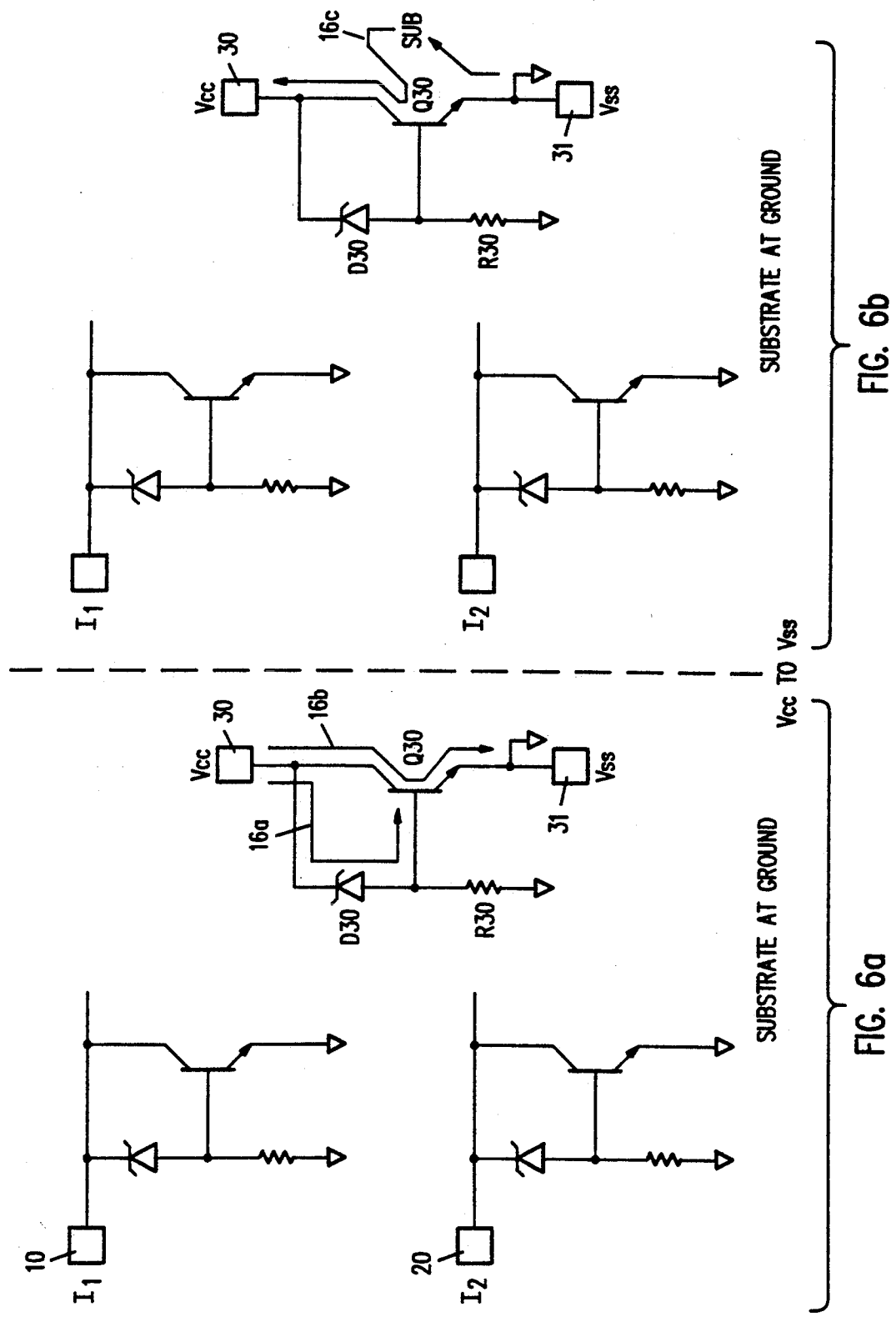

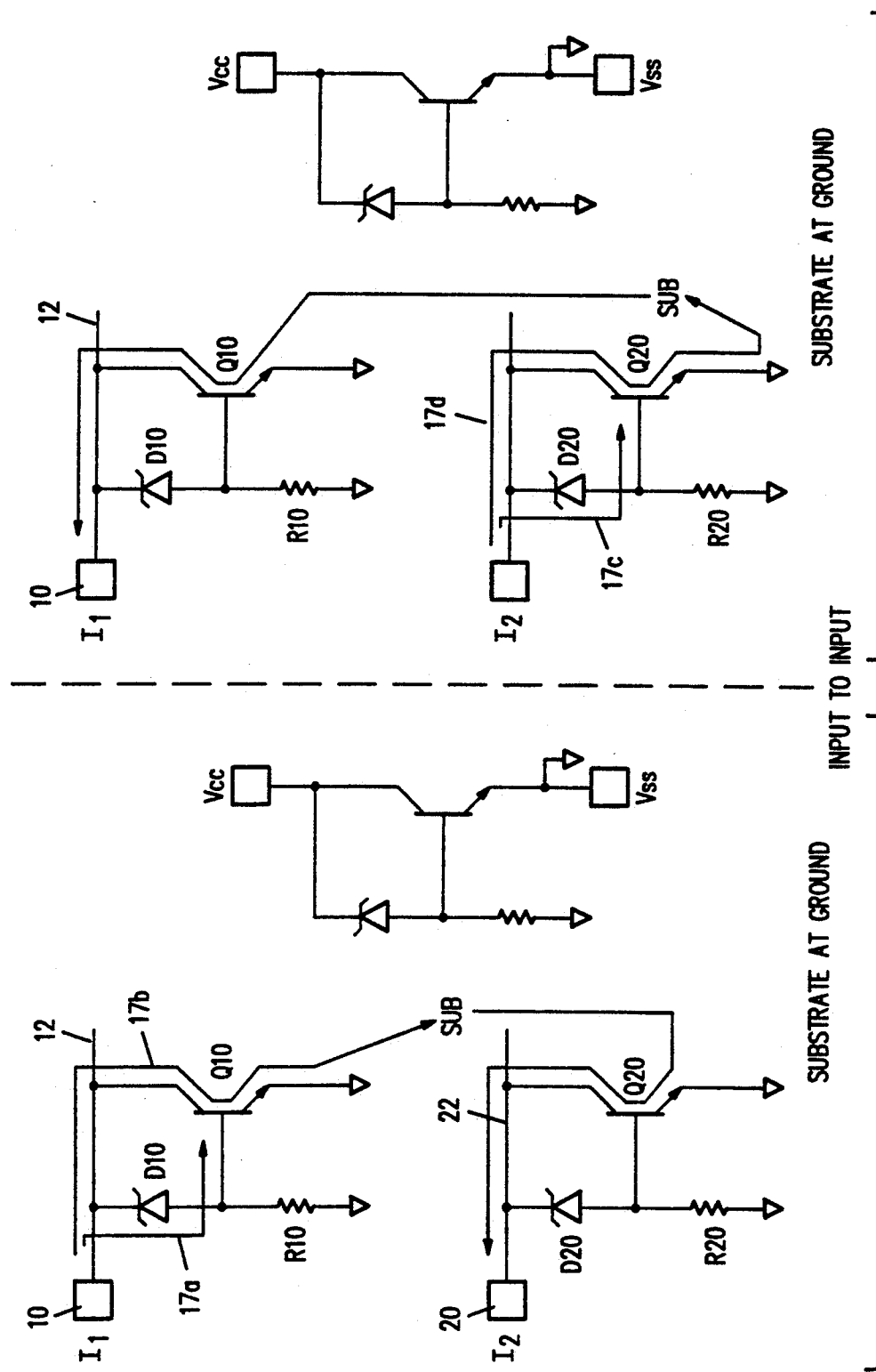

ESD PROTECTION USING NPN BIPOLAR TRANSISTOR

FIELD OF THE INVENTION

The present invention relates generally to protection circuits and, more specifically, to circuitry which protects against electrostatic discharge (ESD) in an integrated circuit.

BACKGROUND

Electrostatic discharge (ESD) in semiconductor integrated circuits (IC's) is a well-known problem. The inadvertent presence of a sudden voltage spike in an integrated circuit can cause physical destruction of circuit features. For example, ESD-induced spikes can rupture the thin gate oxide of a field effect transistor (FET), or simply degrade the p-n junction of a semiconductor device, effectively destroying proper IC operation. A typical "gate oxide" in a MOS transistor will rupture when its dielectric strength is more than approximately $10^7$ V/cm.

There are three basic models for simulating the effects of ESD events on semiconductor devices: the human body model, the machine model, and the charged device model. These models can be used to construct testers to quantify the resistance of devices to ESD events, and to model the effectiveness of a proposed ESD protection circuit using standard circuit simulation techniques.

The human body model is intended to simulate the effect of human handling on semiconductor devices. In FIG. 1, the capacitance C1 simulates the capacitance of the human body and is generally chosen to be 100 pf. The resistance R1 simulates the series resistance of the human body and is usually modeled as 1.5 K$\Omega$. The capacitor C1 is charged to an initial voltage V1 and then discharged into the device under test (DUT). Devices which can withstand precharge voltages on the order of 2 to 3 Kev are considered acceptable by industry standards. A widely followed standard for testing according to the human body model is presented in MIL-STD-883C, notice 8, method 3015.7, "Electrical Discharge Sensitivity Test" (1989).

The machine model or "zero ohms" model utilizes the circuit of FIG. 1, except that C1 is 200 pf and R1 approximates "zero ohms." In a practical construction, R1 is in the range of 20 to 40 ohms. The discharge time constant of the machine model is much less than the human body model, and parasitic circuit components have more influence over the maximum current and voltage seen by the DUT during the discharge. A device that can withstand 400 volts is considered acceptable by industry standards. This model is commonly used in Japan and is covered in EIAJ Standards of the Electronic Industries Association of Japan, IC-121 Book 2 (1988).

The charged device model is used to simulate the ESD failure mechanisms associated with machine handling during the packaging and test of semiconductor devices. According to this model, an IC package is charged to a potential (100 volts to 2000 volts) by triboelectricity or by the presence of large electric fields. Then, the device is discharged to ground via any of the device pins. The charging is normally done via the substrate pin and the discharge is initiated by touching a device pin with a grounded low inductance probe. The time constant for this discharge process is less than 150 ps, and the discharged energy depends on the package capacitance.

The charged device model simulates an ESD event during machine handling of packaged semiconductor devices. ESD damage from machine handling is becoming more significant than ESD damage from human handling because attention has been focused on minimizing human ESD damage, but relatively little work has been done on minimizing ESD damage from machines. No official standard yet exists for the charged device model, but a standard is expected shortly from the EOS/ESD Association, Device Standards Committee.

Junction leakage is a common form of ESD failure. A 2000 volt human body model is equivalent to 0.2 mj of energy, which is enough energy to raise 85,000 $\mu m^3$ of silicon from room temperature to its melting point. It follows that an ESD event has enough energy to do considerable damage to the silicon crystal structure of a semiconductor device. Some material technologies are thus inherently more sensitive to this type of damage than others. For example, contacts formed with Al/-TiW/PtSi$_2$ metallurgy are much more susceptible to junction leakage than contacts formed with W/TiW/-TiN metallurgy due to the ability of the TiW/TiN barrier to withstand higher temperatures. Salicided junctions tend to be more sensitive to junction leakage than non-salicided junctions because the salicide causes current crowding towards source-drain and active area edges, thereby increasing local power densities.

The most common ESD failure mechanism for advanced CMOS processes, especially as feature sizes continue to scale down and the inherent gate oxide breakdown voltages scale down accordingly, is the destruction of gate oxide integrity.

Less commonly, opens failures occur in the path of the ESD current. For example, vias in series with the inputs can become open circuits, or polysilicon series resistors intentionally placed in the protection networks as current limiters can absorb excessive energy and vaporize. Normally, this type of failure can be addressed by following layout rules which ensure that adequate current carrying capacity is present in all paths where large ESD currents would flow.

A conventional CMOS input protection network is illustrated in FIG. 2. When the polarity of the ESD stress is negative with respect to ground, diode D1 becomes forward biased. As long as the diode series resistance is low enough, voltages seen by the circuit remain low enough to minimize on chip power dissipation and protect the CMOS gate oxide. For example, the human body model charged to 3 KeV corresponds to an instantaneous current of 2 amps. Therefore, the diode series resistance should be no more than 4 ohms in order to keep total voltage seen by the circuit to 8 volts, corresponding to the worst case breakdown for a 10 nm gate oxide typical of a 0.5 $\mu$m CMOS process.

When the ESD stress is positive with respect to ground, there are two possibilities for current flow. First, diode D2 charges up until it reaches reverse breakdown, at which point the rise in voltage at the input tends to be clamped. Unfortunately, the reverse breakdown for D2 may be higher than the gate oxide breakdown, thus allowing voltages damaging to input or output device buffers to pass. Second, diode D1 becomes forward biased and begins to charge up Vcc until some breakdown mechanism on the die, such as parasitic field turn-on, gate oxide breakdown, or latchup, clamps the rise in Vcc. It is this mechanism that causes failures internal to the die during ESD stress.

Therefore, if the maximum voltage reached on the die can be reduced, the power dissipated on chip during the ESD stress will be reduced, which in turn will reduce junction temperatures reached during the stress and therefore reduce the junction leakage failure mechanism. At the same time, stress on the gate oxides will also be reduced. Therefore, it is desirable to minimize the voltage excursions seen by the circuit during stress. This can be done by reducing the breakdown voltage of the input diode D2 or by reducing the Vcc/Vss breakdown, while at the same time ensuring that the series resistance after breakdown is minimized. Devices that have snap back or latchup properties have been used to achieve lower breakdown voltages, but there are some disadvantages: the trigger voltage may be high enough to exceed the gate oxide breakdown, causing a momentary pulse of possibly damaging gate current; negative resistance devices are difficult to model with traditional circuit simulation techniques, and also, the device characteristics are sensitive to layout in a way that is difficult to predict; latchup depends on minority carrier diffusion across relatively long lateral base widths, and this process may not be fast enough to respond to an ESD event, especially for the charged device model; and, if the negative resistance characteristic is pronounced enough, it may degrade the latchup performance of the device. Thus, it would be desirable to construct a protection circuit that avoids these disadvantages.

SUMMARY OF THE INVENTION

A protection circuit is utilizable with an integrated circuit ("IC") for protecting the IC features from electrostatic discharge ("ESD"). An IC package has at least a first contact for supplying a first reference voltage to the IC, a second contact for supplying a second reference voltage to the IC, and a plurality of I/O contacts for electrically contacting respective circuit features of the IC. The cathode of a first zener diode is connected to the first contact. The collector of a first transistor is connected to the first contact. The emitter of the first transistor is connected to the second contact. The anode of the first zener diode is connected to the first terminal of a first resistor and to the base of the first transistor. The second terminal of the first resistor is connected to the second voltage reference. The cathode of a second zener diode is connected to an I/O contact. The collector of a second transistor is connected to the I/O contact. The emitter of the second transistor is connected to the second voltage reference. The anode of the second zener diode is connected to the first terminal of a second resistor and to the base of the second transistor. The second terminal of the first resistor is connected to the second voltage reference.

A better understanding of the features and advantages of the present invention will be obtained by reference to the following detailed description of the invention and accompanying drawings which set forth an illustrative embodiment in which the principles of the invention are utilized.

BRIEF DESCRIPTION OF THE DRAWINGS

FIG. 4a is a circuit schematic of the preferred embodiment of an ESD protection circuit constructed according to the present invention.

FIGS. 4b, 5a, 5b, 6a, 6b, 7a, 7b, illustrate the operation of the circuit of FIG. 4a during an ESD event.

DETAILED DESCRIPTION OF THE INVENTION

Figure 1:
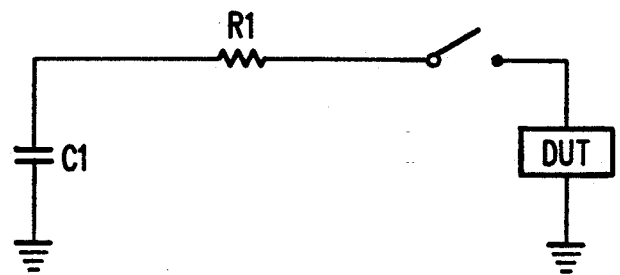
FIG. 1 is a circuit schematic for an ESD testing technique.
Figure 2:
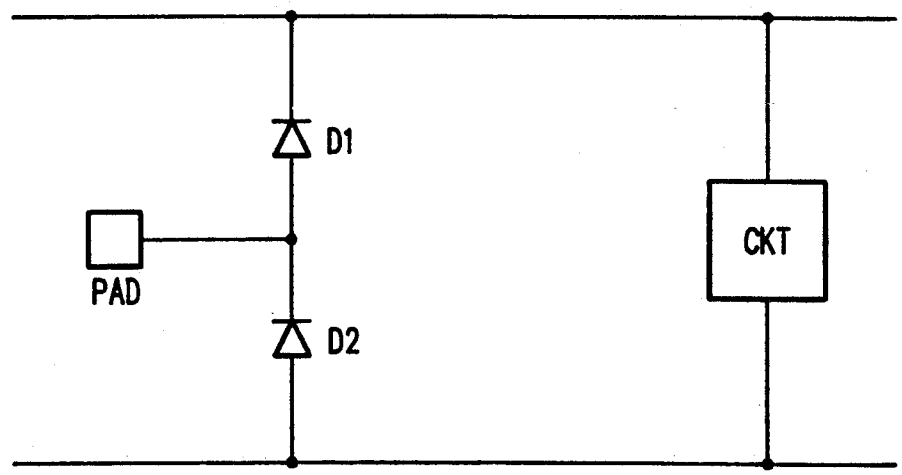
FIG. 2 is a circuit schematic of a conventional ESD protection circuit.
Figure 3A:
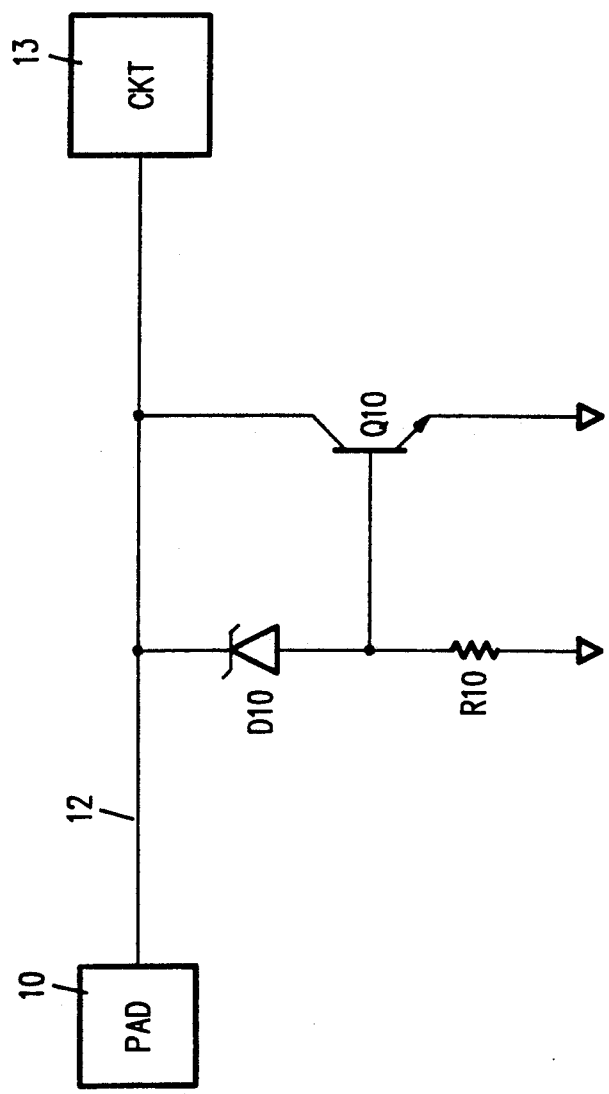
FIG. 3a is a circuit schematic of an ESD protection circuit constructed according to the present invention.
Figure 3B:
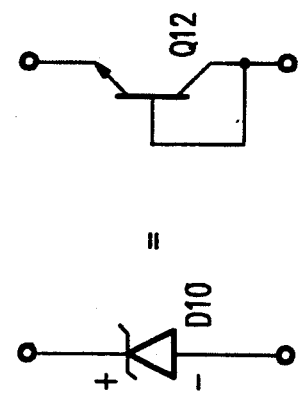
FIG. 3b illllustrates the use of a npn bipolar transistor to realize a Zener Diode.

Referring now to FIG. 3a, a semiconductor integrated circuit package typically includes a contact pad 10 which is electrically connected to the integrated circuit feature 13 via an interconnect 12. According to the present invention, a zener diode D10 has its anode connected to the base of an npn bipolar transistor Q10 and its cathode connected to interconnect 12. The diode D10 can be realized using a diode connected npn bipolar transistor Q12, as shown in FIG. 3b. Such a device can be built to have a diode area of $16.8 \times 3.0$ $\mu m^2$, thus providing a reverse breakdown voltage of approximately 6 volts. The collector of transistor Q12 should have a low resistance (a few ohms) to minimize the sum of the zener reverse breakdown voltage and the voltage drop as a result of the ESD current.

A resistor R10 is connected between the base of the transistor Q10 and ground. The emitter of transistor Q10 is connected to ground, and the collector of transistor Q10 is connected to interconnect 12.

The transistor Q10 is a npn bipolar transistor that is large in area so that parasitic resistances are small. For example, the emitter area can be realized on a die area of $4 \times 103 \times 2.8$ $\mu m^2$. In that way, voltage built up by the ESD current can remain small.

A preferred embodiment of an ESD protection circuit is illustrated in FIG. 4a, in which a typical integrated circuit chip package includes at least a first I/O pad 10, a second I/O pad 20, a first reference voltage pad 30, and a second reference voltage pad 31. The first reference voltage pad 30 is for supplying VCC to the IC, and the second reference voltage pad 31 is for supplying VSS to the IC. VSS is typically tied to ground, and thus the substrate of the semiconductor devices of the IC are also typically grounded.

Diode D10 is connected between interconnect 12 and the base of transistor Q10. Resistor R10 is connected between VSS and the base of transistor Q10. The collector of transistor Q10 is connected to interconnect 12, and the emitter of transistor Q10 is connected to VSS. Likewise, diode D20 is connected between interconnect 22 and the base of transistor Q20. Resistor R20 is connected between VSS and the base of transistor Q20. The collector of transistor Q20 is connected to interconnect 22, and the emitter of transistor Q20 is connected to VSS. Further, diode D30 is connected between pad 30 (VCC) and the base of transistor Q30. Resistor R30 is connected between pad 31 (VSS=ground) and the base of transistor Q30. The collector of transistor Q30 is connected to VCC, and the emitter of transistor Q30 is connected to VSS.

The circuit configuration illustrated in FIG. 4a will now be utilized to describe each of the four possible ESD events, namely (1) I/O to VSS, (2) I/O to VCC, (3) VCC to VSS, and (4) I/O to I/O.

In FIGS. 4a and 4b, the ESD event is between I/O pad 10 and VSS. In FIG. 4a, a positive going ESD pulse reverse biases diode D10 (see arrow 14a), thereby forward biasing the base-emitter junction of transistor Q10 and causing the collector-emitter channel to conduct the ES current to VSS (ground) along the path indicated by arrow 14b. In FIG. 4b, a negative going ESD pulse causes the collector of transistor Q10 to become more negative in potential than the emitter and therefore the substrate, thus causing the channel to conduct a reverse current through the substrate to the collector, and the ESD pulse is dissipated along the path indicated by arrow 14c.

In FIGS. 5a and 5b, the ESD event is between I/O pad 10 and VCC. In FIG. 5a, an ESD pulse with a positive polarity relative to VCC reverse biases diode D30 thereby forward biasing base-emitter junction of transistor Q30 and causing the collector-emitter channel of transistor Q30 to conduct the ESD current to VSS along the path indicated by arrow 15a. Since VSS is tied to the substrate, the base-collector junction of transistor Q10 becomes forward biased such that the ESD current is conducted through the substrate to the collector to pad 10 as shown by arrow 15b. In FIG. 5b, a negative going ESD pulse reverse biases diode D10 (arrow 15c) thereby forward biasing the base-emitter junction of transistor Q10 and causing the channel of transistor Q10 to conduct the ESD pulse to the substrate. Since the substrate is tied to VSS pad 31, the emitter and substrate of transistor Q30 are raised above the collector and the ESD pulse is conducted through the substrate to VCC along the path indicated by arrow 15d.

In FIGS. 6a and 6b, the ESD event is between VCC and VSS. In FIG. 6a, a positive going ESD pulse quickly overcomes the reverse breakdown voltage of diode D30 (arrow 16a), thereby forward biasing the base-emitter junction of transistor Q30 and causing the collector-emitter channel of transistor Q30 to conduct the ESD current to VSS (ground) as shown by arrow 16b. In FIG. 6b, a negative going ESD pulse causes the collector of transistor Q30 to become more negative in potential than the emitter and the substrate, thus, the ESD pulse is conducted to VCC via the substrate as shown by arrow 16c.

In FIGS. 7a and 7b, the ESD event is between I/O pins 10 and 20. In FIG. 7a, an ESD pulse having a positive polarity relative to pad 10 quickly overcomes the reverse breakdown voltage of diode D10 (arrow 17a), thereby forward biasing base-emitter junction of transistor Q10 and causing the collector-emitter channel of transistor Q10 to conduct the ESD current to the substrate as shown by arrow 17b. In FIG. 7b, an ESD pulse having a negative polarity relative to pad 10 has a positive polarity relative to pad 20. Therefore, diode D20 becomes reverse biased (arrow 17c), thereby forward biasing the base-emitter junction of transistor Q20 and causing the collector-emitter channel of transistor Q20 to conduct the ESD current to the substrate as shown by arrow 17d. Since the collector of transistor Q10 is dropped below the emitter and substrate, the substrate conducts to the collector as shown by arrow 17d.

It should be understood that the invention is not intended to be limited by the specifics of the above-described embodiment, but rather defined by the accompanying claims.

We claim:

1. A protection circuit utilizable with an integrated circuit ("IC") for protecting the integrated circuit features from a pulse of electrostatic discharge ("ESD"), wherein a package containing the IC includes a plurality of pads for electrically contacting respective features of the IC via an interconnect, including at least a first pad contacting a first IC feature via a first interconnect, a second pad contacting a second IC feature via a second interconnect, a third pad for providing a first reference voltage to the IC via a third interconnect, and a fourth pad for providing a second reference voltage to the IC via a fourth interconnect, the protection circuit comprising:

a zener diode having an anode and a cathode;
   a first bipolar transistor having a base, a collector, and an emitter; and
   a resistor having a first and a second terminal, wherein the cathode of the zener diode is connected to the first interconnect, the collector of the first transistor is connected to the first interconnect, the anode of the zener diode and the base of the first transistor are connected to the first terminal of the resistor, and the emitter of the first transistor and the second terminal of the resistor are connected to the fourth interconnect.

2. The protection circuit according to claim 1, wherein the zener diode comprises a second bipolar transistor having its base connected to its collector to form the anode, its emitter forming the cathode.

3. A protection circuit utilizable with an integrated circuit ("IC") for protecting circuit features of the integrated circuit from a pulse of electrostatic discharge ("ESD"), wherein an IC package containing the IC has at least a first contact for supplying a first reference voltage to the IC, a second contact for supplying a second reference voltage to the IC, and a plurality I/O contacts for electrically contacting respective I/O circuit features of the IC, the protection circuit comprising:

a plurality of zener diodes each having an anode and a cathode;
   a plurality of bipolar transistors each having a base, a collector, and an emitter; and
   a plurality of resistors each having a first and a second terminal,
   wherein the cathode of a first zener diode is connected to the first contact, the collector of a first transistor is connected to the first contact, the emitter of the first transistor is connected to the second contact, the anode of the first zener diode is connected to the first terminal of a first resistor and to the base of the first transistor, and the second terminal of the first resistor is connected to the second voltage reference, and
   wherein for each I/O circuit feature, the cathode of a second zener diode is connected to an I/O contact, the collector of a second transistor is connected to the I/O contact, the emitter of the second transistor is connected to the second voltage reference, the anode of the second zener diode is connected to the first terminal of a second resistor and to the base of the second transistor, and the second terminal of the first resistor is connected to the second voltage reference.

4. The protection circuit according to claim 3, wherein each zener diode comprises a third transistor having its base connected to its collector to form the anode and its emitter forms the cathode.

* * * * *